United States Patent
Seeber et al.

(10) Patent No.: US 7,206,726 B2
(45) Date of Patent: Apr. 17, 2007

(54) METHOD OF DESIGNING PARTIALLY COMPOSITE CONCRETE SANDWICH PANELS AND SUCH PANELS

(75) Inventors: Kim E. Seeber, Cantonment, FL (US); Rex C. Donahey, Farmington Hills, MI (US)

(73) Assignee: Composite Technologies, Corporation, Boone, IA (US)

(*) Notice: Subject to any disclaimer, the term of this patent is extended or adjusted under 35 U.S.C. 154(b) by 424 days.

(21) Appl. No.: 10/389,165

(22) Filed: Mar. 14, 2003

(65) Prior Publication Data
US 2004/0181379 A1 Sep. 16, 2004

Related U.S. Application Data

(60) Provisional application No. 60/366,129, filed on Mar. 20, 2002.

(51) Int. Cl.
*G06F 17/10* (2006.01)

(52) U.S. Cl. .................. 703/2; 52/80.1; 52/309.1; 52/414; 52/405.1; 52/425; 52/410; 52/435

(58) Field of Classification Search ........... 52/741.1, 52/426, 745.05; 428/364
See application file for complete search history.

(56) References Cited

U.S. PATENT DOCUMENTS

| | | | | |
|---|---|---|---|---|
| 5,440,845 | A * | 8/1995 | Tadros et al. | 52/309.12 |
| 5,709,061 | A * | 1/1998 | Dietrich | 52/426 |
| 2002/0033000 | A1 * | 3/2002 | Pantelides et al. | 52/745.05 |
| 2004/0038027 | A1 * | 2/2004 | Lovett et al. | 428/364 |
| 2005/0284088 | A1 * | 12/2005 | Heath | 52/741.1 |

OTHER PUBLICATIONS

Gastmeyer, R., "Bemessung der Vorsatzschalen dreischichtiger AuBenwandplatten aus Stahlbeton", Springer-VDI Verag, 1997, pp. 235-240.

* cited by examiner

*Primary Examiner*—Kamini Shah
*Assistant Examiner*—Cuong Van Luu
(74) *Attorney, Agent, or Firm*—Kent A. Herink; Daniel A. Rosenberg; Emily E. Harris

(57) ABSTRACT

A method for calculating using a digital computer an approximation of properties of a concrete sandwich panel. The method allows for a manufacturer of concrete sandwich panels to design sandwich panels using a range of available components to meet architectural specifications.

1 Claim, 6 Drawing Sheets

METHOD OF DESIGNING PARTIALLY COMPOSITE CONCRETE SANDWICH PANELS AND SUCH PANELS

This application claims priority to United States Patent Application Ser. No. 60/366,129, filed Mar. 20, 2002.

BACKGROUND OF THE INVENTION

The invention relates generally to insulated concrete sandwich panels and, more specifically, to a method that permits a manufacturer of concrete sandwich panels to design sandwich panels using a range of available components to meet architectural specifications.

Insulated concrete sandwich wall panels are well known in the art. Typically, a concrete sandwich wall panel is created by installing a layer of insulating material between two layers of concrete. In order to create a safe assembly capable of resisting handling and service imposed forces, the insulation layer must be penetrated by a connection system that ties the two layers of concrete together.

Concrete sandwich wall panels clad the exterior of a building and must resist lateral forces (wind and seismic forces acting normal to the plane of the panel), gravity loads, and temperature-induced forces. They also may be required to carry in-plane horizontal forces if the panels are used as shear walls. Lateral forces as well as temperature differentials between the two concrete layers induce shear forces in the connection systems as well as bending, shear, and axial forces in both layers of concrete in the panel.

In the current art, sandwich panels are designed as composite, partially composite, or non-composite. A composite sandwich panel of a given total thickness will have nearly the same stiffness and strength as a solid panel of the same thickness. In contrast, a non-composite panel will have roughly the same stiffness and strength as the sum of the stiffness and strength values for the individual concrete layers comprising the wall panel. Partially composite walls will have stiffness and strength that are intermediate to the values for composite and non-composite panels.

So-called composite walls are normally constructed with steel trusses passing the insulation. The steel trusses provide high shear stiffness and (although it is not practical to completely eliminate differential slip and local bending), limit differential slip between the concrete layers sufficiently to allow nearly complete strain compatibility between the sandwich layers to exist over the full length of the panel up to relatively high magnitudes of applied lateral loads. These panels are therefore very efficient in resisting lateral loads. Unfortunately these panels also have severely reduced insulation performance as the steel trusses have high thermal conductivity and therefore create massive thermal bridges through the insulation.

Non-composite wall panels are normally constructed using flexible connectors that are installed perpendicular to the plane of the insulation. Because the connectors provide low shear restraint, large differential slip between the concrete layers is possible. At very low load magnitudes, strain compatibility between the sandwich layers breaks down. These panels are therefore very inefficient in resisting lateral loads.

In the current art, partially composite panels are constructed using the same flexible connectors used in non-composite walls. However, the panels are made to be partially composite by removing sections of insulation to provide discrete, through-thickness concrete zones. These zones are normally located at the ends and at intermediate points along the length of the panel and locally limit the slip between the concrete layers; however, the flexible connectors in the zones between through-thickness concrete connections will allow local slip. Although the uncracked stiffness of such panels can be nearly the same as for a composite panel, partially composite panels will tend to crack at lower loads than composite panels. Also, the through-thickness concrete zones used to achieve partial composite action create massive thermal and vapor bridges through the insulation.

Although composite and partially composite walls are much more efficient than geometrically similar non-composite walls in resisting normal forces, the connection system's enforcement of strain compatibility between the concrete layers can create undesirable behaviors. The primary function of an insulated concrete sandwich panel is to provide a thermal barrier between the ambient environment and the conditioned air within the building. The thermal barrier must, therefore, lead to significant temperature differentials between the two concrete layers. Consequentially, as one concrete layer increases in temperature, it expands in the plane of the panel. The connection system and the other concrete layer eccentrically restrain this expansion, leading to "thermal bowing" of the assembly analogous to that observed with a bimetallic strip. Similar behavior will occur in composite or partially composite panels with different levels of prestressing between the two layers. While this can be primarily an aesthetic problem, it can also lead to failure of the sealant at the joints between panels. This effect is most dramatic at the building corners, where the differential movement is magnified by the geometry of the joint. In contrast, a non-composite wall connection system allows nearly unrestrained in-plane movement of the two concrete layers. Thermal bow is minimized, and joint sealants are less likely to fail.

Each of the wall types therefore has positive and negative features. Although non-composite wall panels are generally too flexible or have insufficient strength to safely resist wind loads, many composite and partially composite wall panels have excess capacity and suffer from thermal and differential shrinkage induced bowing. There is a need for an intermediate, partially composite connection system for concrete sandwich panels that provides adequate resistance to lateral loads while providing minimal thermal bowing and provides a thermally efficient wall panel.

SUMMARY OF THE INVENTION

It is, therefore, a primary object of the present invention to provide a method of designing a concrete sandwich wall having partially composite behavior.

It is another object of the present invention to provide a method for the selection of a connection system that allows partial composite action while providing highly efficient thermal properties.

It is also an object of the present invention to provide a rational design algorithm that is calculated using a digital computer for selecting the concrete layer thickness as well as the spacing of the individual components of the connection system.

A partially composite panel designed in accordance with the concepts of the present invention has a plurality of connectors passing through and perpendicular or oblique to the plane of the insulation system. These connectors have sufficient bending and or shear stiffness to provide signifi cant shear transfer between the two concrete layers as the panel is subjected to wind or seismic forces applied normal to the plane of the panel. The size, spacing, and material type of the connectors can be selected to optimize the structural performance of the panels. Structural optimization, in this case, involves 1) providing sufficient overall stiffness of the panel to limit deflections to acceptable values under working loads, and 2) providing sufficient overall strength of the panel to avoid structural failure, or collapse, of the panel under overload conditions. Structural optimization may also include providing sufficient material properties, pre-compression levels, section sizes, and interlayer shear stiffness and strength to avoid cracking of the concrete layers under working or overload conditions. In this process, the combined effects of loading applied normal to the panel (wind or seismic effects) and of temperature differentials are considered. Acceptable levels of performance are defined in building codes. Because these codes are incorporated by reference into ordinances and statutes, compliance is the legal and ethical requirement for the professional engineer in responsible charge of the building design. In order to satisfy the primary purpose of the wall panel, to create a thermal barrier for the building exterior, the thermal conductivity of the connector material must be selected and/or the number of connectors selected to produce the desired thermal properties for the panel. The material and connector selection process may allow a hybrid system of materials and connector sizes to be selected and used. A flowchart of the method is attached.

Using the method of the present invention, connector stiffness, connector thermal properties, connector spacing, and connector thickness will be selected such that: The stiffness of the resulting insulated panel will be no less than 33 percent of a solid panel of the same overall thickness; the strength of the resulting insulated panel will be no less than 50 percent of the strength of a solid panel of the same overall thickness; and the thermal efficiency of the panel will be no less than 80 percent of the thermal efficiency of the inter-wythe insulation.

DETAILED DESCRIPTION OF PREFERRED EMBODIMENTS

Short-Term Shear Loading—Closed-Form Analysis

Gastmeyer's closed-form solution was developed for the calculation of the concrete forces induced by temperature and wind effects on sandwich panels (FIG. 1) (Gastmeyer, R., "Bemessung der Vorsatzschalen dreischichtiger Außenwandplatten aus Stahlbeton," *Bauingenieur* 72, pp 235–240, 1997). The invention relies on improvements to and simplifications of the Gastmeyer solution to determine the normal and bending forces in the concrete layers as well as the connector shear forces induced by temperature and wind effects.

Figure 1:
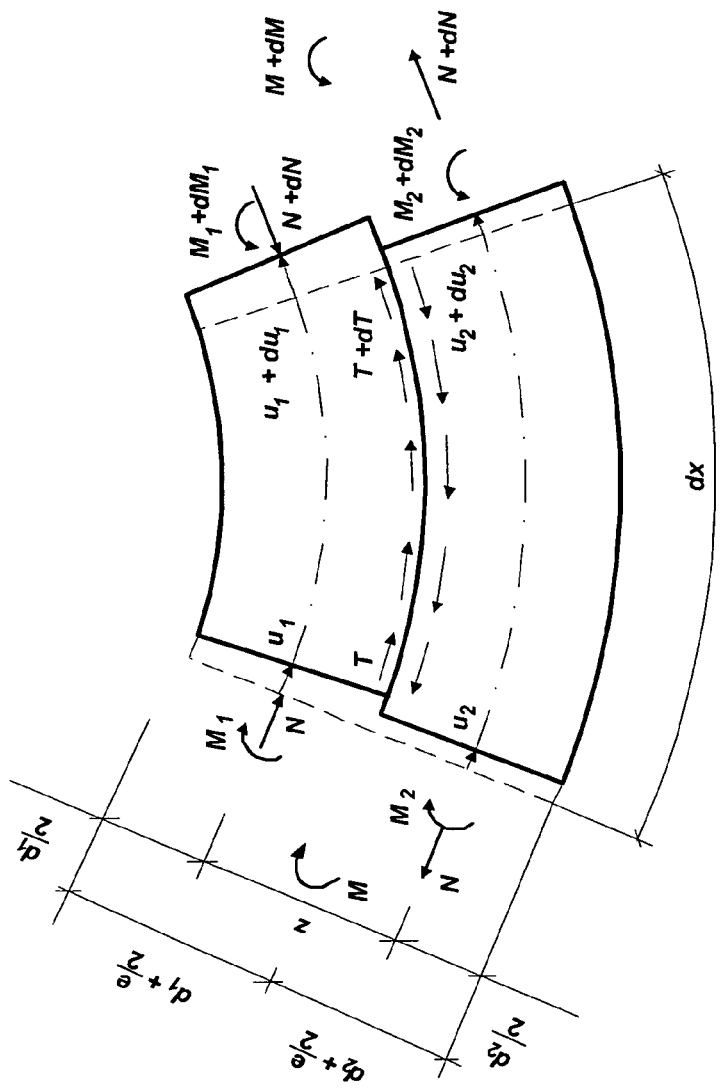
FIG. 1 is a diagrammatical figure of a differential element of a sandwich panel.
Figure 2:
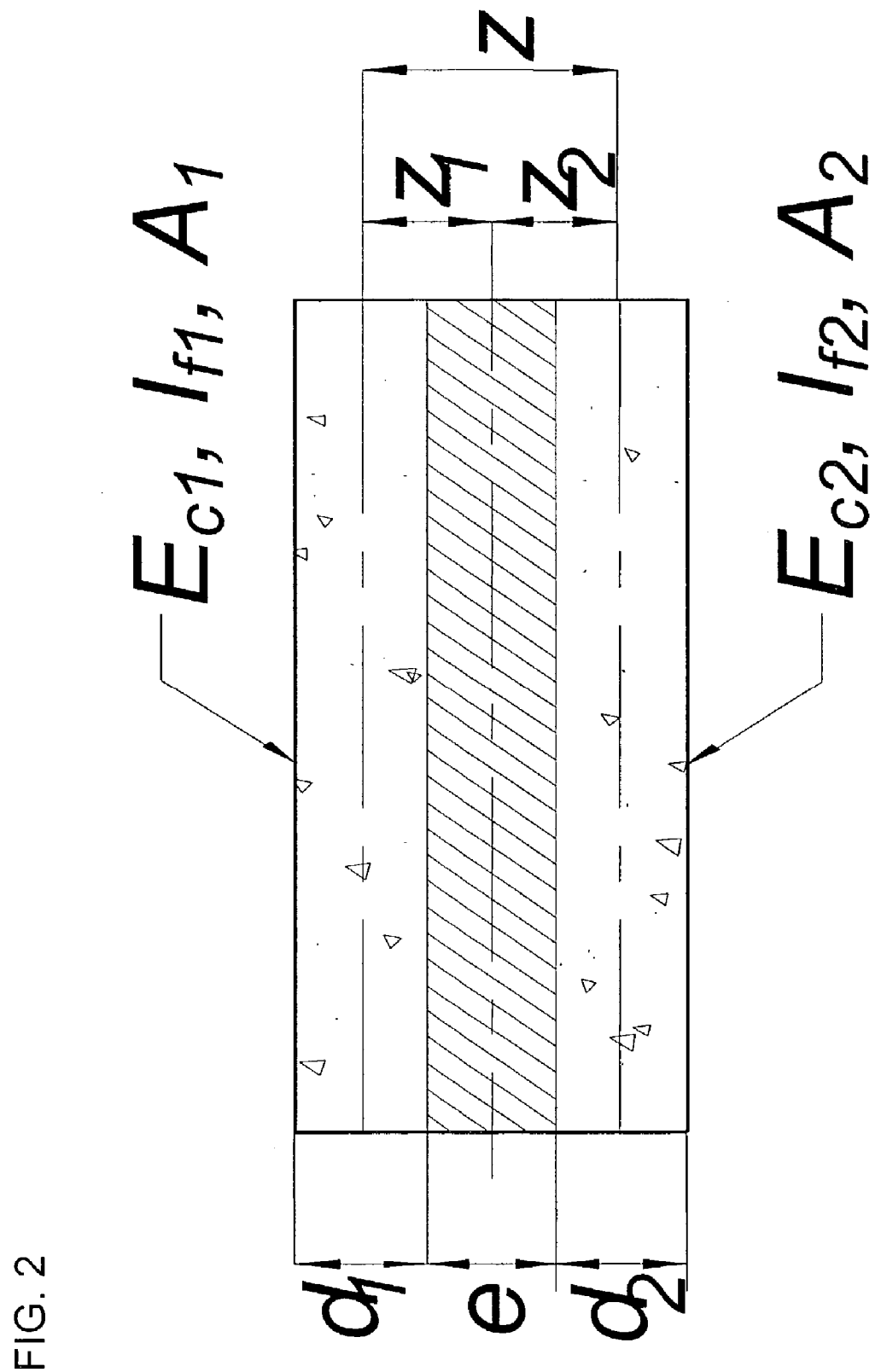
FIG. 2 is a cross section of a sandwich panel showing the variables used in some of the equations.

In the calculation of the internal layer and connector forces, the moments of inertia for the individual layers, $I_f$, and the full section, I are required. The term I is often referred to as the composite moment of inertia for the sandwich panel. Using I, calculation of panel stiffness defines the upper bound for the panel stiffness for any connector system selection. $I_f$ and I are given by $$I_f = I_{f1} + I_{f2} \tag{1}$$

$$= \frac{b}{12}(d_1^3 + d_2^3)$$

and $$I = \frac{bz^2 d_1 d_2}{d_1 + d_2} + I_f \tag{2}$$

where b=the unit width of the panel (for convenience, b, can be set as the connector spacing in the direction perpendicular to the span), z=the distance between the centroidal axes of the two layers, and $d_1$ and $d_2$=the thicknesses of the exterior and interior concrete layers, respectively (FIGS. 1 and 2). The distance z is given by $$z = e + (d_1 + d_2)/2 \tag{3}$$

Additional parameters required are the areas of the layers, $A_1$ and $A_2$ and the distance from the centroidal axis for the external layer to the centroidal axis for the composite section, $z_1$. The areas are be given by $$A_1 = bd_1 \tag{4}$$

and $$A_2 = bd_2 \tag{5}$$

The distance $z_1$ is given by $$z_1 = \frac{zd_2}{d_1 + d_2} \tag{6}$$

Note that the above relationships apply to flat concrete layers. Ribbed structural layers, with internal or external ribs, can also be modeled by using the correct relationships for the centroid locations, areas, and moments of inertia as required.

The characteristic shear (design value) and stiffness used for a connector may be obtained from tests on isolated connectors. It is also possible to calculate the connector stiffness, $C_B$, for a connector with fixed rotation imposed at each end of a span $d_A$:

$$C_B = \frac{1}{\frac{d_A^3}{12 \cdot E_{Ab} \cdot I_A} + \frac{d_A}{A_{Aw} \cdot G_A}} \tag{7}$$

where $E_{Ab}$, $G_A$, $I_A$, and $A_{Aw}$ represent the material and section properties of the connectors.

The solution to the differential equations for the connector forces within a panel are determined using an auxiliary value, ω, given by $$\omega = \sqrt{\frac{C_B}{E_B \cdot a} \cdot \left(\frac{1}{A_1} + \frac{1}{A_2} + \frac{z^2}{I_f}\right)} \quad (8)$$

in which a=the longitudinal spacing of the connectors and $E_B$=the mean modulus of elasticity for the concrete layers.

Equations (7) and (8) have been uniquely combined to create an equation that defines the panel stiffness and consequently, its resulting behavior. By rearranging and combining the previous equations a factor, $R_G$, has been developed so that the panel stiffness characteristics and load response can be better understood and defined. The $R_G$ function for a uniformly loaded, simple-span panel is, $$R_G := \left[\frac{(I - I_f)}{I}\right] \cdot \left[1 - \frac{\frac{8}{L^2}\left(\cosh\left(\omega \cdot \frac{L}{2}\right) - 1\right)}{\left(\omega^2 \cdot \cosh\left(\omega \cdot \frac{L}{2}\right)\right)}\right] \quad (9)$$

The normal forces in the concrete, N, are calculated using the function, $$N := \frac{R_G}{z} \cdot M \quad (10)$$

The local, or secondary, bending moments in the concrete layers, $M_1$ and $M_2$, are determined by subtracting the couple (Nz) from the total static moment and distributing the difference in proportion to the bending stiffness of each concrete layer (FIG. 1). A mathematical expression of the above description is, $$M_1 := (M - N \cdot z) \cdot \frac{E_{c1} \cdot I_{f1}}{(E_{c1} \cdot I_{f1} + E_{c2} \cdot I_{f2})} \quad (11)$$

and, $$M_2 := (M - N \cdot z) \cdot \frac{E_{c2} \cdot I_{f1}}{(E_{c1} \cdot I_{f1} + E_{c2} \cdot I_{f2})} \quad (12)$$

In addition the function, $$I_e := \frac{I_f}{(1 - R_G)} \quad (13)$$

succinctly defines the equivalent moment of inertia, $I_e$ of the panel. This simplistic expression for $I_e$ can be easily used to calculate the panel deflections resulting from transverse loads, such as, wind, and also for deflections as a result of thermal gradient loadings.

Maximum values will occur at midspan for the panel, where the total static moment is at its maximum. However, stresses at any location along the panel span in the concrete layers can be calculated using the relationship, $$f = \frac{N}{A_1} + \frac{M_1 d_1}{2 I_1} - f_{pe} \quad (14)$$

where $f_{pe}$=the stress resulting from prestressing of the concrete layers, if any. This stress is compared against a nominal tensile capacity of the concrete=$7.5\sqrt{f_c'}$ to determine if the concrete has cracked.

The shear forces induced in the connectors by normal wind or seismic forces, $Q_{AK}$, are then determined by a function, g, $$Q_{AK} = g(K, L, A_A, A_1, A_2, z_1, I, \omega, x_H) \quad (15)$$

where K=the uniformly distributed wind or seismic force applied normal to the plane of the panel, in N/m² or in psf, L=the panel span, $A_A$=the tributary area surrounding each connector=a·b, and $x_H$=the distance from the panel support to the connector of interest (normally the connectors located nearest the end supports for the panels).

The shear forces induced in the connectors by temperature differential between the concrete layers, $Q_{A\Delta}\vartheta$, are given by a function, h, $$Q_{A\Delta}\vartheta = h(\Delta\vartheta, \alpha_T, E_B, L, b, A_1, z_1, z, I_f, I, \omega, x_H) \quad (16)$$

where $\Delta\vartheta$=the temperature differential between the concrete layers (in °C.) and $\alpha_T$=the coefficient of thermal expansion for concrete, °C.$^{-1}$.

The shear forces induced by normal forces and by temperature differential are functions of the connector location within the span of the panel. Maximum values will occur at the ends of the panel. For simplicity, $x_H$ is assumed to be equal to a/2.

Figure 6:
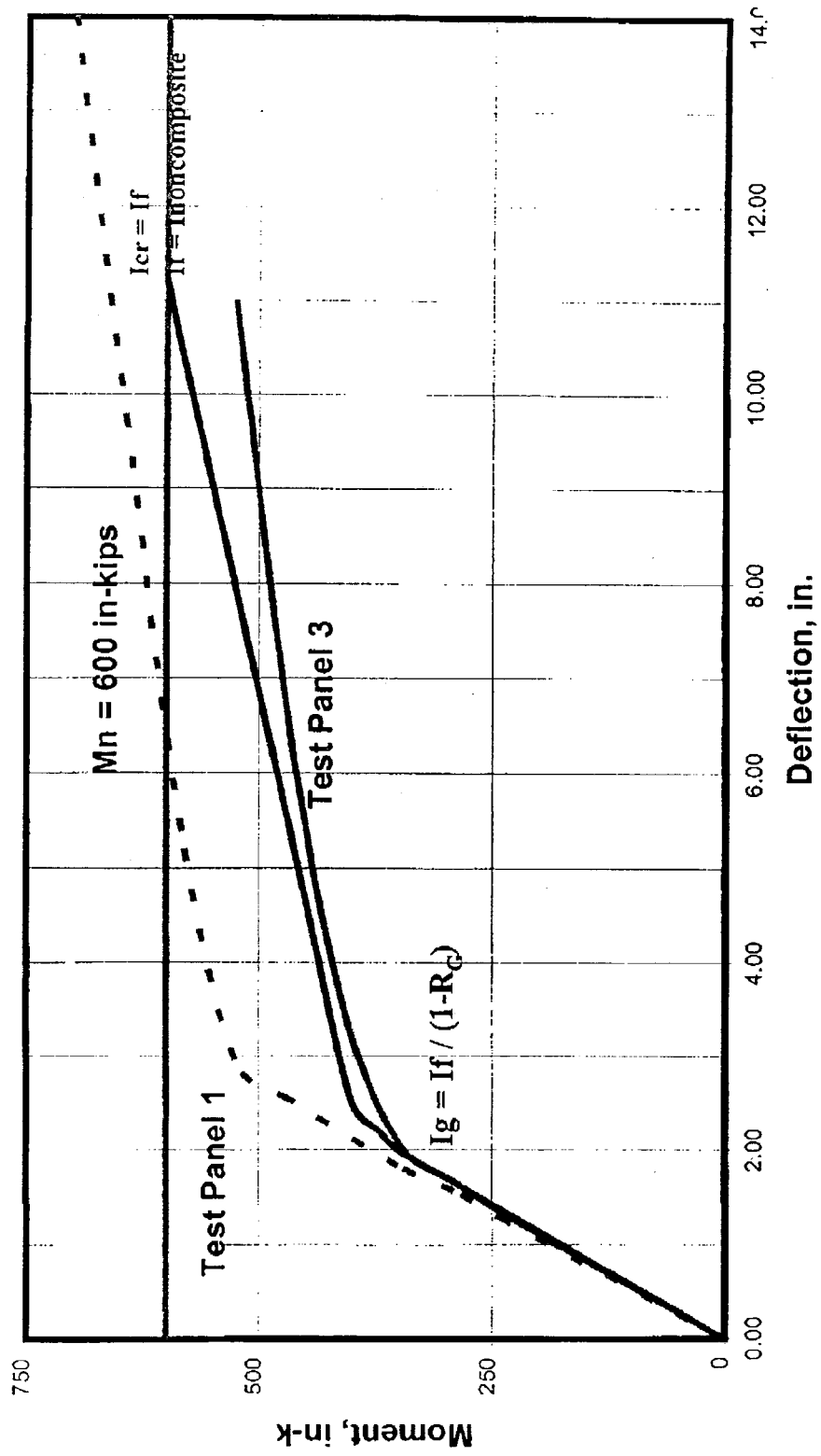
FIG. 6 is a graphical representation of the calculated and actual deflection vs. moment for two panels one having concrete wythes of 1.875 inches, an insulation thickness of 2.25 inches and a connector spacing of 16 inches and the other having concrete wythes of 2 inches, an insulation thickness of 2 inches and a connector spacing of 16 inches.

In FIG. 6, the load-deflection curve determined using the described method is plotted together with test data taken on two panels having the below stated parameters, that is, ATI (Architectural Testing Incorporated, York, Pa.) test panel 1 had interior and exterior concrete layer thicknesses of 1.875 inches, insulation thickness of 2.25 inches, and a connector spacing of 16 inches, and ATI test panel 3 had interior and exterior concrete layer thicknesses of 2 inches, insulation thickness of 2 inches, and a connector spacing of 16 inches.

Figure 3:
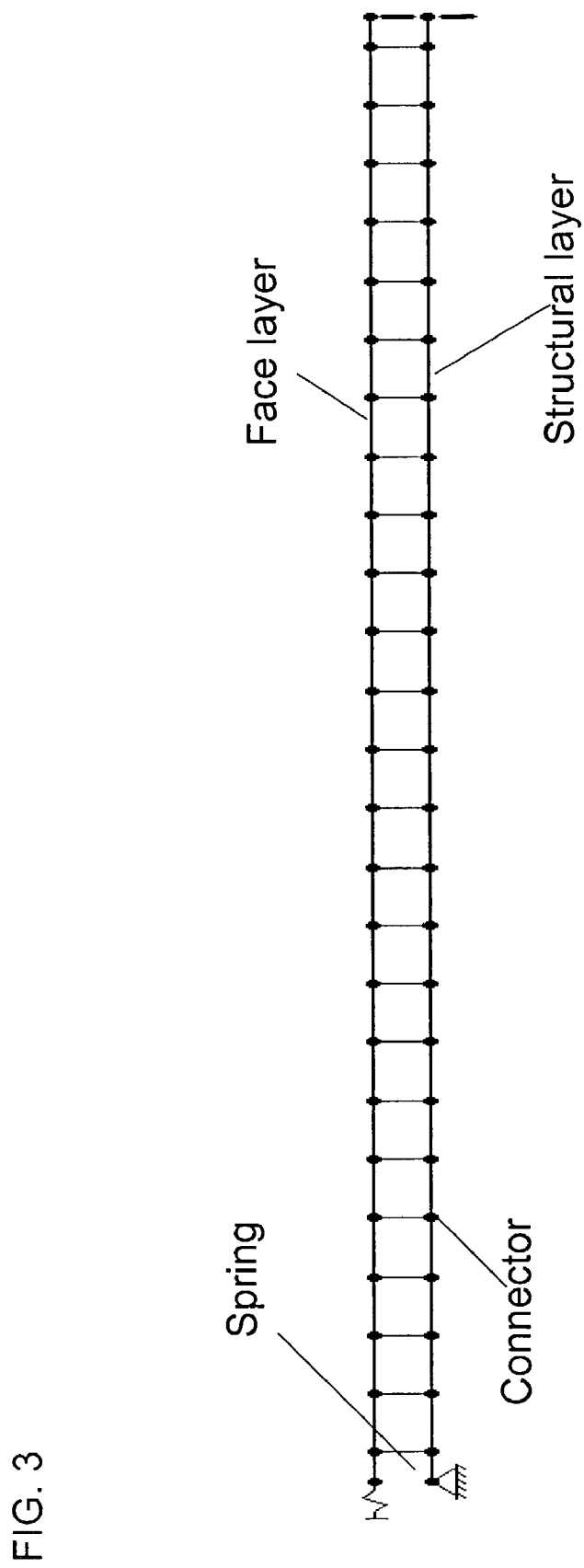
FIG. 3 is a model of sandwich panel showing a compression spring at base of face layer.
Figure 4:
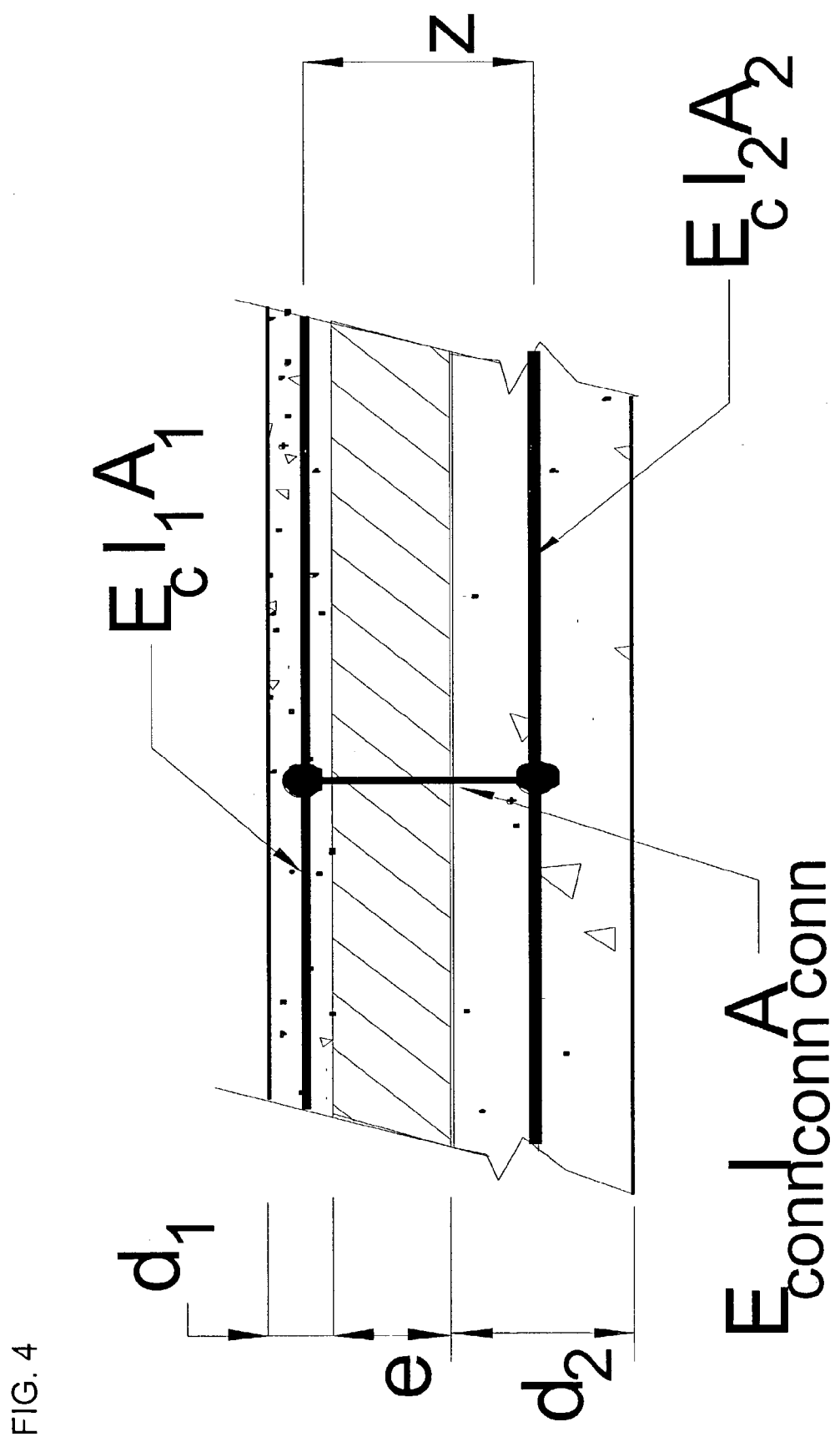
FIG. 4 is a diagrammatic view of a stiffness model superimposed on a concrete sandwich panel.
Figure 5:
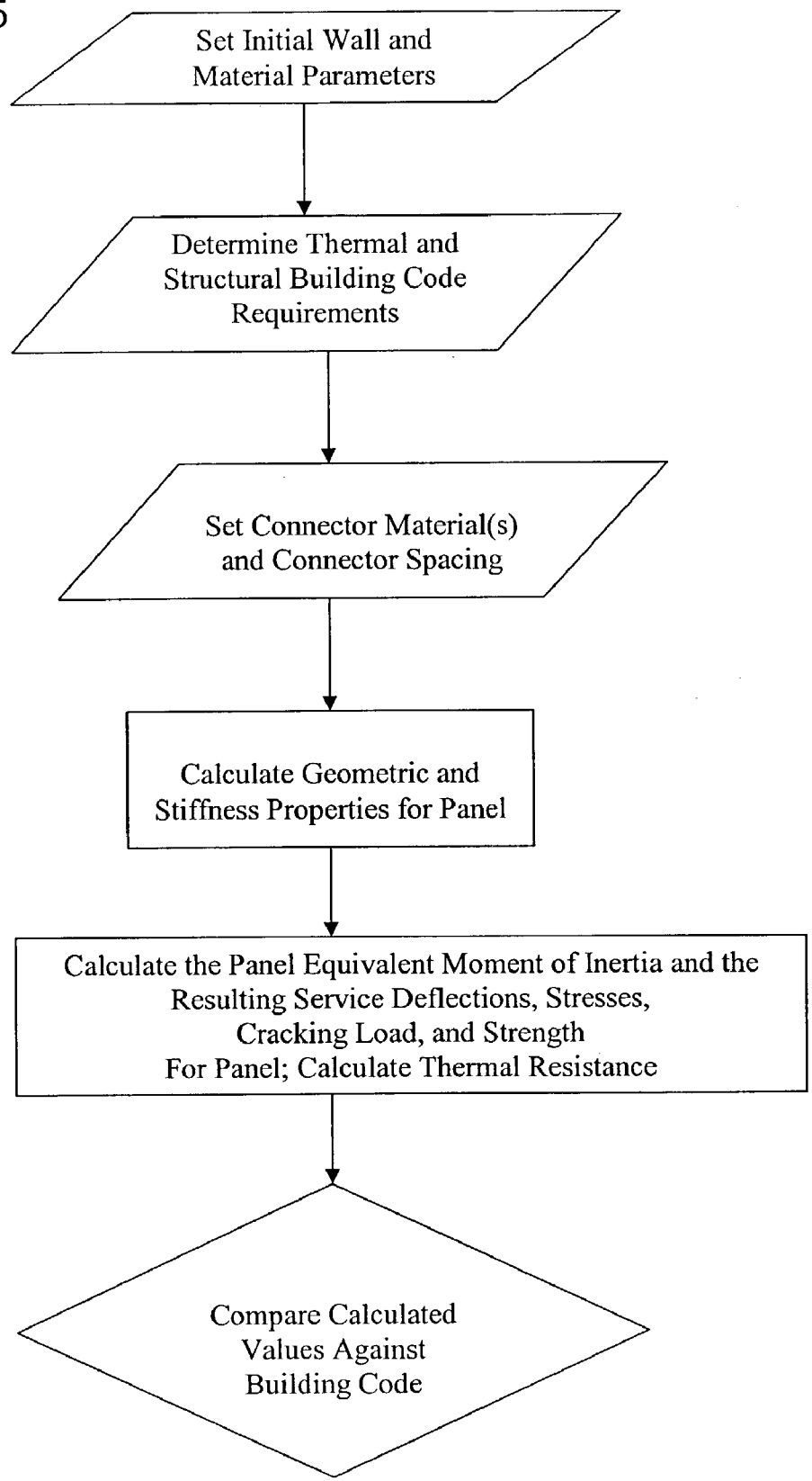
FIG. 5 is a flow chart diagram of the method taught by the present invention.

The load-deflection curves are bi-linear approximations with the initial portions of the curve determined using an approximation of the stiffness that is obtained using the ω value as described. After the panel begins to crack, the panel softens and the second portion of the bilinear curve can be determined using empirical approximations. Fortunately, the deflection associated with the nominal capacity of the panel is important only when secondary effects become important. Secondary effects (aka P-Delta effects, buckling, or unstable equilibrium) are, however, extremely important in slender members that carry significant axial compression (panels carrying roof and/or floor loads). In the Figures, the curves are approximated by using a cracked moment of intertia=$I_f$, an approximation which is reasonable given the current test data Short-Term Shear Loading—Stiffness Method Analysis The sandwich panel can also be represented using a commercially available stiffness analysis program by creating elements representing the two concrete layers and the connectors (FIGS. 3 and 4). The elements representing the connectors may be defined as having the same modulus of elasticity as used in the closed-form solution. However, the element length will be the distance z. Therefore, if the analysis program lacks eccentricity transformations (in simple form, rigid links), then the connector element moment of inertia used in the stiffness analysis, $I_{conn}$, must be set equal to $$I_{conn} = \frac{z^3}{d_A^3} I_A \qquad (17)$$

to compensate for the change in bending length of the connector.

As described previously, closed-form or stiffness method analyses can also be used to determine the deflections due to normal forces and temperature differential. These are compared against limits prescribed in building codes.

The strength of the panel is usually evaluated using code specified force levels. The strength of the panel will be limited by either the shear capacity of the connector system, the tensile capacity of the longitudinal reinforcing within the tensile layer of concrete, or if panel cracking has sufficiently softened the panel to lead to loss of stability. Portions of the above discussion are illustrated in the example provided in the Appendix.

For the selected insulation and connector system, the thermal performance of the panel is evaluated using the isothermal planes method of analysis. This method has been shown to provide conservative agreement with test data.

The method may also be used to evaluate hybrid connector systems, in which either the size or the material, or both, are varied to provide the optimum panel behavior and cost. Fiber composite materials typically have thermal conductivity values of approximately 0.3 W/m/° C. Normal weight concrete is commonly assigned a conductivity of 2.3 W/m/° C. ANSI 304 stainless steel has a conductivity=14.3, mild steel has a conductivity of 48, and galvanized steel sheet can have conductivity as high as 62 W/m/° C.

In hybrid applications, it is acceptable to locate small areas of steel connectors at critical locations along the span of the panel. While these local areas will create zones with high thermal conductivity, the effect on the total panel can be limited such that the total effect on the optimum panel efficiency is less than 20 percent. The location of these local zones of thermal inefficiency can be selected to optimize structural stiffness and strength, thereby offsetting lifetime thermal costs with first-cost savings.

The geometry of the connectors as well as the locations of the connectors can be optimized to take advantage of material properties and manufacturing processes. For most applications, it is reasonable to anticipate that the connectors will be in the form of plates or bars. However, for connectors fabricated using high conductivity materials and located near the ends of a panel where shear forces are at their maximum, relatively short truss-type elements will provide the optimum solution.

Although the invention has been described with respect to a preferred embodiment thereof, it is to be also understood that it is not to be so limited since changes and modifications can be made therein which are within the full intended scope of this invention as defined by the appended claims.

APPENDIX

STIFFNESS/STRENGTH CALCULATION

Geometric Input

Member Dimensions

| | | |
|---|---|---|
| Member Width, ft | | 1.50 |
| Member Length, ft | | 36.00 |
| Support Dist. From Start, ft | | 0.00 |
| Support Dist. From End, ft | | 0.00 |
| Net Span Length, ft | | 36.00 |
| Interior Wythe Thickness, in | | 3.00 |
| Exterior Wythe Thickness, in | | 3.00 |
| Insulation Thickness, in | | 2.00 |
| Total Panel Thickness, in | | 8.00 |

Connector Input

| | | |
|---|---|---|
| Longitudinal Connector Spacing, in | a | 16.00 |
| Transverse Connector Spacing, in | b | 18.00 |
| Connector Extension, in. | | 2.165 |
| Number of connectors across width | | 1 |
| Total number of connectors in panel | | 27 |
| Connector Area, in$^2$ | $A_{AW}$ | 0.31 |
| Connector Moment of Inertia, in$^4$ | $I_A$ | 0.0879 |

Reinforcing Steel Input
Total Longitudinal Area per Layer, in$^2$

| | | |
|---|---|---|
| Interior Layer Reinforcing | (0.12)(1.5) | 0.18 |
| Dist. Int. Layer Reinf. Centroid to Interior Face | | 1.80 |
| Exterior Layer Reinforcing | (0.12)(1.5) | 0.18 |
| Dist. Ext. Layer Reinf. Centroid to Exterior Face | | 1.80 |

Prestressing Strand Input
Prestressing Strand Area, in$^2$

| | | |
|---|---|---|
| Interior Layer Prestressing | (1)(0.115) | 0.115 |
| Dist. Int. Layer Prestr. Centroid to Interior Face | | 1.50 |
| Exterior Layer Prestressing | (1)(0.115) | 0.115 |
| Dist. Ext. Layer Prestr. Centroid to Exterior Face | | 1.50 |

Material Input

Concrete

| | |
|---|---|
| Unit Wt., pcf | 145 |
| 28 day strength, psi | |
| Interior Wythe | 5000 |
| Exterior Wythe | 5000 |

Modulus of Elasticity, ksi

| | |
|---|---|
| Interior Wythe [33wc$^{1.5}$(f'ci)$^{1/2}$]/1000 | 4074 |
| Exterior Wythe [33wc$^{1.5}$(f'ci)$^{1/2}$]/1000 | 4074 |
| Average Modulus, Ec = ½ (Eci + Ece) | 4074 |
| ACI β factor for Interior Wythe | 0.80 |
| ACI β factor for Exterior Wythe | 0.80 |
| Coefficient of Thermal Expansion, (in/in)/deg F. (Default 6.0 × 10$^{-6}$) | $6 \cdot 10^{-6}$ |

Connector Input

| | | |
|---|---|---|
| Tensile Strength, ksi | | 12.00 |
| Shear Strength, ksi | | 12.00 |
| Bending Modulus of Elasticity, ksi | $E_{Ab}$ | 4351 |
| Tensile Modulus of Elasticity, ksi | $E_{At}$ | 5802 |
| Shear Modulus, ksi | $G_A$ | 725 |

Reinforcing Steel Input

| | |
|---|---|
| Yield Strength, ksi(60 Default) | 60 |
| Modulus of Elasticity ksi | 29000 |

Prestressing Strand Input

| | |
|---|---|
| Ultimate Strength, ksi | 270 |
| Modulus of Elasticity, ksi (Function) | |
| Inside Wythe Initial Jacking Stress (% of Ult. Strength) | 75 |
| Losses, % | % = 10 |
| Exterior Wythe Initial Jacking Stress (% of Ult. Strength) | 75 |
| Losses, % | % = 10 |

APPENDIX-continued

STIFFNESS/STRENGTH CALCULATION

Loading Input

Wind Pressure

| | |
|---|---|
| Direct Pressure, psf | 22 |
| Suction Pressure, (−)psf | −22 |

Temperature Gradient*

| | |
|---|---|
| Positive Temperature Gradient, R | 60 |
| Negative Temperature Gradient, R | −10 |

*Positive indicates exterior temperature is greater than interior temperature
Service Load Cases (ASCE 7-98 & IBC-2000)
Service 1. Dead + Wind
Service 2. 0.6Dead + Wind
Service 3. Dead + Temperature
Design (Strength) Load Cases (ASCE 7-98 & IBC-2000)
Strength 1. 1.2Dead + 1.6Wind
Strength 2. 0.9Dead + 1.6Wind
Strength 3. 1.2Dead + 1.2Temperature

| | |
|---|---|
| Distance between Concrete Layers, in | 5.00 |
| Moment of Inertia of Interior Layer, in$^4$ | 40.50 |
| Section Modulus of Interior Layer, in$^3$ | 27.00 |
| Moment of Inertia of Exterior Layer, in$^4$ | 40.50 |
| Section Modulus of Exterior Layer, in$^3$ | 27.00 |
| Sum of Layer Moments of Inertia, in$^4$ | 81.00 |
| Composite Moment of Inertia, in$^4$ | 756.00 |
| Area of Interior Layer, in$^2$ | 54.00 |
| Area of Exterior Layer, in$^2$ | 54.00 |
| $C_B =$ | 59.63 (Reference Equation (7)) |
| $\omega =$ | 0.213 (Reference Equation (8)) |
| $R_G =$ | 0.777 (Reference Equation (9)) |
| $I_e = I_F/(1 - R_G) =$ | 363 in$^3$ (Reference Equation (13)) |
| $M_{wd}$ = Direct Wind Midspan Moment | 64 in-kips |
| $M_{ws}$ = Suction Wind Midspan Moment | −64 in-kips |
| Panel Cracking Moment due to Direct Wind | 136 in-kips |
| Panel Cracking Moment due to Suction Wind | −136 in-kips |

| | | |
|---|---|---|
| $N_{wd} = (R_G/z) \times M_{wd}$ | 9.97 kips | -Reference Equation (10) |
| $N_{ws} = (R_G/z) \times M_{ws}$ | −9.97 kips | -Reference Equation (10) |
| Interior Wythe Direct Wind Moment | 7.2 in-kips | -Reference Equation (11) |
| Exterior Wythe Direct Wind Moment | 7.2 in-kips | -Reference Equation (11) |
| Interior Wythe Suction Wind Moment | −7.2 in-kips | -Reference Equation (11) |
| Exterior Wythe Suction Wind Moment | −7.2 in-kips | -Reference Equation (11) |

Connector Shear Capacity (all values in kips)

| | |
|---|---|
| Direct Wind Factored Calculated Connector Shear | 1.98 O.K. |
| Connector Capacity (with partial safety factor) | 2.60 |
| Suction Wind Factored Calcluated Connector Shear | −1.98 O.K. |
| Connector Capacity (with partial safety factor) | −2.60 |
| Factored Positive Temperature Calculated Shear | 1.63 O.K. |
| Connector Capacity (with partial safety factor) | 2.60 |
| Factored Negative Temperature Calculated Shear | −0.27 O.K. |
| Connector Capacity (with partial safety factor) | −2.60 |
| Effective Prestress in Interior Wythe = 0.388 | |
| Effective Prestress in Exterior Wythe = 0.388 | |

Direct Wind Pressure Stresses*

| | | |
|---|---|---|
| Inside/Interior Wythe | 0.505 ksi | The inside of the interior wythe is not cracked |
| Outide/Interior Wythe | −0.025 ksi | The outside face of the inter. wythe is not cracked |
| Inside/Exterior Wythe | 0.344 ksi | The inside face of the exterior wythe is not cracked |
| Outside/Exterior Wythe | 0.874 ksi | The outside face of the exterior wythe is not cracked |

*Negative values indicate tension in concrete

Suction Wind Pressure Stresses*

| | | |
|---|---|---|
| Inside/Interior Wythe | 0.344 ksi | The inside face of the interior wythe is not cracked |
| Outide/Interior Wythe | 0.874 ksi | The outside face of the interior wythe is not cracked |
| Inside/Exterior Wythe | 0.505 ksi | The inside face of the exterior wythe is not cracked |
| Outside/Exterior Wythe | −0.025 ksi | The outside face of the exterior wythe is not cracked |

*Negative values indicate tension in concrete

Ultimate Moment Capacity, in-kips

Direct Wind
Connector Capacity Controls
Ultimate Moment Check
Wind Capacity = 226>
Required (Factored) Wind Moment = 103* in-kips
*Ultimate moment capacity is adequate
Wind Suction
Connector Capacity Controls
Ultimate Moment Check
Wind Capacity = −226>
Required (Factored) Wind Moment = −103* in-kips
*Ultimate moment capacity is adequate Wind Deflections Direct Wind Total, in. = 0.84    Direct Wind Deflection
Limit = L/240, in. = 1.80
Deflection limit is not exceeded, therefore panel stiffness is adequate Suction wind Total, in. = −0.84    Suction Wind Deflection
Limit = L/240, in. = −1.80
Deflection limit is not exceeded, therefore panel stiffness is adequate Thermal Bowing Calculations Outward Bowing = 1.29 in < L/240 = 1.8
The outward thermal bow is less than L/240, therefore, the panel is adequate
Inward Bowing = −0.22 in < L/240 = −1.8
The outward thermal bow is less than L/240, therefore, the panel is adequate

We claim:

1. A method of calculating in a digital computer properties of a concrete sandwich panel having an exterior concrete wythe and a spaced-apart interior concrete wythe and a plurality of connectors which have opposite ends embedded in both of the wythes, wherein the calculated properties of the panel comprise stiffness, strength, and thermal efficiency, comprising the steps of:

(a) providing as input data the thickness of the wythes, the connector spacing in the direction perpendicular to the length of the connectors, the distance between the centroidal axes of the two wythes, the areas of the wythes, the distance from the centroidal axis of the interior wythe to the centroidal axis of the exterior wythe, the stiffness of the connectors, the longitudinal spacing of the connectors, and the mean modulus of elasticity of the wythes;

(b) calculating a first panel factor which approximates the stiffness characteristics and load response of the sandwich panel;

(c) calculating from the first panel factor an equivalent moment of inertia of the panel;

(d) verifying that the properties are within pre-established specifications for the sandwich panel, and wherein the calculated stiffness is no less than 33% of a solid panel of the same overall thickness, the strength of the panel is no less than 50% of the strength of a solid panel of the same thickness, and the thermal efficiency of the panel is no less than 80% of the thermal efficiently of the inter-wythe insulation.

* * * * *